United States Patent [19]

Martin

[11] Patent Number: 4,536,664

[45] Date of Patent: Aug. 20, 1985

[54] A HIGH SPEED, NON-INVERTING CIRCUIT FOR PROVIDING AN INTERFACE BETWEEN TTL LOGIC GATES AND SCHOTTKY TRANSISTOR LOGIC GATES

[75] Inventor: Robert C. Martin, Dallas, Tex.

[73] Assignee: Texas Instruments Incorporated, Dallas, Tex.

[21] Appl. No.: 467,105

[22] Filed: Feb. 16, 1983

[51] Int. Cl.³ ............... H03K 19/092; H03K 19/084; H03K 19/013

[52] U.S. Cl. ................... 307/475; 307/458; 307/544; 307/559; 330/257; 323/316

[58] Field of Search ............... 307/443, 456, 457, 458, 307/475, 358, 360, 362, 544, 552, 555, 559, 561, 564, 565, 264, 297; 330/288, 257; 323/312, 315, 316

[56] References Cited

U.S. PATENT DOCUMENTS

| | | | |
|---|---|---|---|
| 3,439,186 | 4/1969 | Seelbach | 307/457 X |
| 3,491,251 | 1/1970 | Witsell | 307/457 X |
| 3,553,486 | 1/1971 | Dow | 307/457 X |
| 3,979,611 | 9/1976 | Payne et al. | 307/458 |
| 4,129,790 | 12/1978 | Gani et al. | 307/458 X |
| 4,405,870 | 9/1983 | Eden | 307/475 X |
| 4,458,162 | 7/1984 | Solomon et al. | 307/456 |

*Primary Examiner*—John S. Heyman
*Assistant Examiner*—David R. Bertelson
*Attorney, Agent, or Firm*—Richard A. Bachand; N. Rhys Merrett; Melvin Sharp

[57] ABSTRACT

A high speed, noninverting circuit for providing an interface between transistor-transistor logic gates and Schottky transistor logic gates. In one embodiment the output of a TTL circuit is coupled through a Schottky diode to an emitter-follower whose input is Schottky clamped. The output of the emitter-follower is coupled to a constant current sink and to the cathode of a low barrier Schottky diode, the anode of which forms the STL-compatible output of the interface circuit. The present circuit thus performs a noninverting level translation with minimum propagation delay.

7 Claims, 1 Drawing Figure

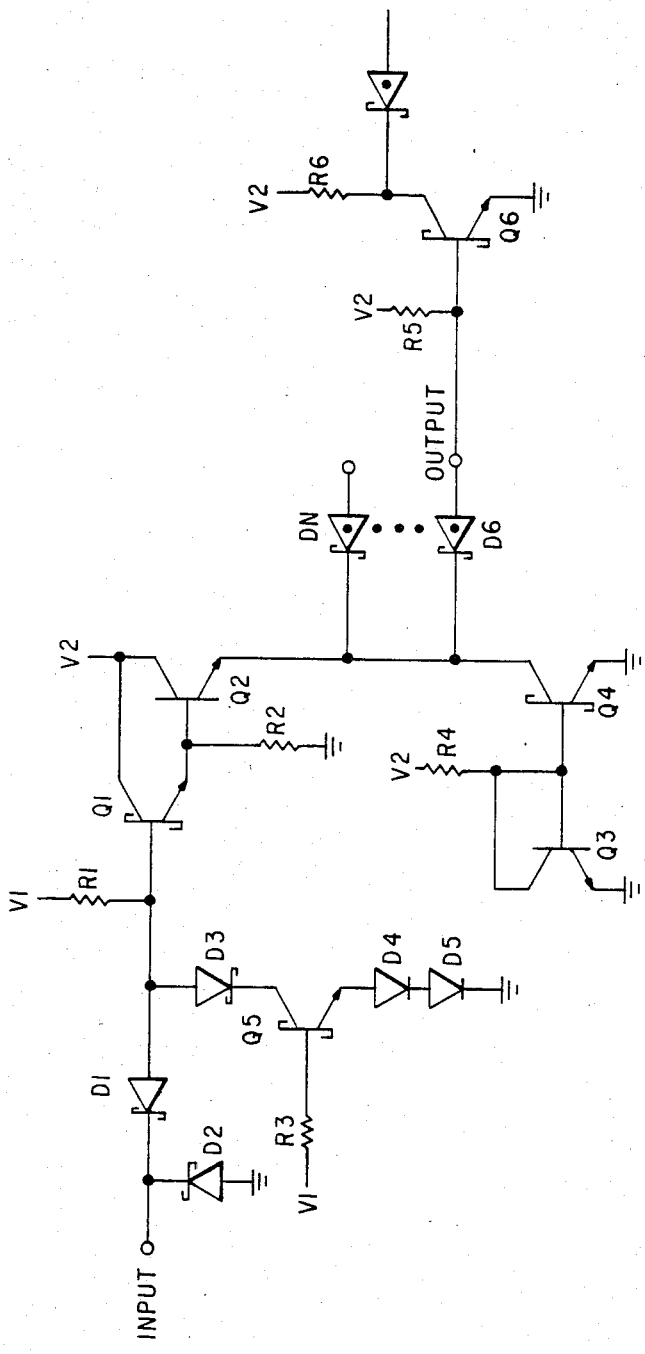

A HIGH SPEED, NON-INVERTING CIRCUIT FOR PROVIDING AN INTERFACE BETWEEN TTL LOGIC GATES AND SCHOTTKY TRANSISTOR LOGIC GATES

BACKGROUND OF THE INVENTION

The present invention relates generally to bipolar logic circuits and more particularly to a circuit for translating one logic voltage level to another.

Schottky transistor logic (STL) gates are advantageously used in integrated circuit devices requiring high packing density, high speed, and low power dissipation. In circuits where STL gates must be coupled to transistor-transistor logic (TTL) gates an interface or buffer circuit must be provided since the TTL and STL voltage levels are incompatible. That is, the TTL transistion level is typically between 0.8-2.0 volts while the STL transistion level is about 0.5 volts. Prior interface circuits use TTL gates to perform the required voltage level translation. However, these circuits provide an inverted output and what in some applications is an unacceptably long propagation delay. If a noninverted output is required, an additional inverter must be included in the interface circuit which further increases the propagation delay. In addition, the power dissipation of the TTL interface circuits limits the IC packing density.

SUMMARY OF THE INVENTION

Accordingly, the present invention overcomes many of the disadvantages of prior logic level translation circuits by providing a noninverting interface circuit having minimum power dissipation and propagation delay.

In one embodiment of the invention for TTL to STL translation, a TTL input signal is coupled through a high barrier Schottky diode to a Schottky clamped emitter-follower. The output of the emitter-follower is coupled to a current mirror which acts as a constant current sink. The emitter-follower output is also coupled to the cathodes of a plurality of low barrier Schottky diodes, the anodes of which form the outputs of the interface circuit. Power dissipation is minimized by coupling the current mirror transistors and the emitter-follower transistors to the STL voltage supply.

BRIEF DESCRIPTION OF THE DRAWING

Other objects and many of the attendant advantages of the present invention will become apparent, and the invention will be better understood, by reference to the following detailed description and appended claims when read in conjunction with the accompanying drawing, which is a schematic diagram of an interface circuit according to one embodiment of the present invention.

DETAILED DESCRIPTION OF THE PREFERRED EMBODIMENT

Referring now to the drawing figure, there is shown an interface circuit for translating TTL level input signals to STL levels. In the illustrated embodiment the input is coupled to the cathodes of two high barrier Schottky diodes D1 and D2. The anode of D1 is coupled to the base of an NPN Schottky transistor Q1 which is in turn coupled to an NPN transistor Q2 in an emitter-follower configuration, that is, the collector of Q1 is connected to the collector of Q2 and the emitter of Q1 is connected to the base of Q2. Resistor R2 is connected between the emitter of Q1 and ground and functions as a turn-off resistor for Q2. The emitter of Q2 is coupled to the collector of an NPN Schottky transistor Q4 whose emitter is connected to ground. Transistor Q4 and transistor Q3 form a constant current source, that is, a current mirror, with their bases and their emitters in parallel and the collector of Q3 connected to it base. The collector of Q4 is connected to the cathodes of one or more low barrier Schottky diodes, $D6-D_N$, the anodes of which form the ouputs of the interface circuit. The voltage swing at the collector of Q4 is limited by clamping the voltage at the base of Q1 by means of diodes D3, D4, D5, and Schottky transistor Q5.

The output of the interface circuit is connected to the input of an STL gate, for example, Schottky transistor Q6.

The emitter follower transistors Q1–Q2 and the current mirror transistors Q3–Q4 are connected to the same voltage source, $V_2$, which supplies the STL gate Q6 that is connected to the output of the interface circuit. The clamp transistor Q5 and the base of Q1 are connected to the voltage source $V_1$ that supplies the input TTL gates (not shown). Although the interface circuit transistors Q1–Q5 could be connected to a single voltage source $V_1$, the circuit as shown reduces the power dissipation of transistors Q1–Q4 proportional to the ratio of voltages $V_2$ and $V_1$.

The current magnitude in the Q3–Q4 current mirror is determined by the ratio of the Q2 and Q4 emitter areas, R4, and the power supply voltage and must be large enough to sink the total current through the output diodes $D6-D_N$ plus any overdrive current necessary to discharge the interconnect line capacitance, that is, the capacitance between the Q2–Q4 interconnection and ground. The constant current sink minimizes power dissipation by making the sink current independent of the Q4 collector-emitter voltage. An alternative is to use a resistor connected from the emitter of Q2 to ground as a current sink. However, this would increase the power dissipation.

As explained above, the base of transistor Q1 is clamped in order to reduce the voltage swing at the collector of Q4 in order to minimize propagation delay. The base of Q1 is clamped to approximately $3V_{BE}$, so that the emitter of Q2 can only pull up to about one $V_{BE}$. D3 is preferably a high barrier Schottky diode so that any parasitic capacitance on the base of Q1 will be on the anode side of D3. The input Schottky diode D2, with its cathode connected to the interface circuit input and its anode connected to ground, reduces ringing or undamped oscillations common to fast switching wave forms.

In operation, as the TTL input goes from a logic "0" to a logic "1", the base of Q1 starts going positive, the base of Q2 goes positive, and the Q2 emitter starts pulling the collector of Q4 to a positive level high enough that the STL gate connected to the interface circuit output senses a logic "1" and switches. It will be apparent that the switching or threshold voltage of an STL gate connected to the output of the interface circuit is:

$$V_{TH} = V_{BE}(Q6) - V_{D6} + V_{BE}(Q2) + V_{BE}(Q1) - V_{D1}$$

$$= 3V_{BE} - (V_{DTiW} + V_{DPtSi})$$

Since the sum of the voltage drops across a low barrier Schottky diode and a high barrier Schottky diode, the threshold voltage is approximately equal to $2V_{BE}$, which is about 1.4–1.5 volts. This is at the midpoint of the nominal TTL switching voltage range of 0.8–2.0 volts.

In selecting the device parameters for the interface circuit, it is preferable that the transistors be sized so that the current density through the emitter-base diode of transistor Q4 and the current density through the output low barrier Schottky diodes be the same as the current density through the external STL gates, so that the Q4 collector voltage will be the same as the collector voltage on transistor Q6. Transistors Q1 and Q4 are Schottky clamped in order to reduce the voltage swing on the Q4 collector and to reduce the storage time in order to minimize propagation delay. This also insures that Q4 will not saturate when its input is at a low level. It will be apparent that the input switching voltage level can be modified to be compatible with other than TTL levels. For example, if transistor Q1 were omitted, the switching level would be approximately $V_{BE}$. Further, if an inverted output is desired from the interface circuit only a single STL gate is required for each output. Thus, an inverted output would appear at the collector of transistor Q6 as shown in the drawing FIGURE. The modified inverting interface circuit is still substantially faster than a comparable known TTL level translation circuit.

Other embodiments of the present invention will readily come to those skilled in the art having the benefit of the foregoing description and drawings. It is therefore to be understood that such modifications are intended to fall within the spirit and the scope of the appended claims.

What is claimed is:

1. A circuit for translating a first logic voltage to a second logic voltage for operative connection to a source of potential, comprising:
    a first high barrier Schottky diode having a cathode to serve as the circuit input,
    an emitter-follower transistor circuit having an input coupled to the anode of said input Schottky diode,
    a second high barrier Schottky diode having an anode coupled to the input of said emitter-follower transistor circuit, and
    a plurality of series-connected diodes, the first of said series-connected diodes having an anode coupled to the cathode of said high barrier Schottky diode and the last of said series-connected diodes having a cathode coupled to ground wherein said input of said emitter-follower transistor circuit is clamped to a voltage level substantially equal to the difference between said first logic voltage and the voltage across said first Schottky diode by said series-connected diodes and said second Schottky diode;
    a low barrier Schottky diode coupled to receive an output from said emitter follower transistor to serve as an output for the circuit; and
    a constant current source coupled to said low barrier Schottky to sink the current therethrough.

2. The circuit of claim 1 wherein said low barrier Schottky diode has a cathode coupled to the output of said emitter-follower transistor circuit wherein the anode of said low barrier Schottky diode comprises the output of said logic voltage translating circuit.

3. The circuit of claim 2 wherein said constant current source comprises:
    a first Schottky clamped transistor having a collector coupled to said emitter-follower transistor circuit output and to a cathode of said low barrier Schottky diode, and an emitter coupled to ground; and
    a second transistor having a collector coupled to its base and to the base of said first Schottky clamped transistor, a collector coupled to a source of potential and an emitter coupled to ground.

4. The circuit of claim 3 wherein said second Schottky diode and the input of said emitter-follower transistor circuit are coupled to a first logic voltage supply, said emitter-follower transistor circuit having at least one collector which with said second transistor of said constant current source are coupled to a second logic voltage supply.

5. The circuit of claim 1 further comprising a plurality of Schottky diodes, each having a cathode coupled to the output of said emitter-follower transistor circuit wherein the anode of each of said plurality of Schottky diodes comprises an independent output of said logic voltage translating circuit.

6. The circuit of claim 5 wherein said constant current source comprises:
    a first Schottky clamped transistor having a collector coupled to said emitter-follower transistor circuit output and to the cathodes of said plurality of output Schottky diodes, and an emitter coupled to ground; and
    a second transistor having a collector coupled to its base and to the base of said first Schottky clamped transistor, a collector coupled to a source of potential, and an emitter coupled to ground.

7. The circuit of claim 6 wherein said second Schottky diode and the input of said emitter-follower transistor circuit are coupled to a first logic voltage supply, and said emitter-follower transistor circuit having at least one collector which with said second transistor of said constant current source are coupled to a second logic voltage supply.

* * * * *